United States Patent
Gerousis et al.

(10) Patent No.: US 9,245,076 B2
(45) Date of Patent: Jan. 26, 2016

(54) ORTHOGONAL CIRCUIT ELEMENT ROUTING

(71) Applicant: International Business Machines Corporation, Armonk, NY (US)

(72) Inventors: Vassilios Gerousis, San Jose, CA (US); Lars W. Liebmann, Poughquag, NY (US); Stefanus Mantik, San Jose, CA (US); Gustavo E. Tellez, Essex Junction, VT (US); Shuo Zhang, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 13/908,562

(22) Filed: Jun. 3, 2013

(65) Prior Publication Data

US 2014/0359548 A1    Dec. 4, 2014

(51) Int. Cl.
    *G06F 17/50*    (2006.01)
(52) U.S. Cl.
    CPC ........ *G06F 17/5072* (2013.01); *G06F 17/5077* (2013.01)
(58) Field of Classification Search
    None
    See application file for complete search history.

(56) References Cited

U.S. PATENT DOCUMENTS

| | | | |
|---|---|---|---|
| 8,214,778 B2 * | 7/2012 | Quandt et al. | 716/100 |
| 8,356,268 B2 * | 1/2013 | Becker et al. | 716/126 |
| 8,741,763 B2 * | 6/2014 | Ma et al. | 438/599 |
| 8,782,586 B2 * | 7/2014 | Sezginer et al. | 716/126 |
| 8,813,016 B1 * | 8/2014 | Hsu et al. | 716/127 |
| 2011/0014786 A1 * | 1/2011 | Sezginer et al. | 438/618 |

OTHER PUBLICATIONS

Kodama et al., "Self-Aligned Double and Quadruple Patterning-Aware Grid Routing with Hotspots Control," 2013 18th Asia and South Pacific Design Automation Conference, pp. 267-272.*
Gao et al., "Flexible Self-aligned Double Patterning Aware Detailed Routing with Prescribed Layout Planning," 2012 ACM, pp. 25-32.*
Cho et al., "Double Patterning Technology Friendly Detailed Routing," 2008 IEEE/ACM Int'l Conference on CAD, 6 pages.*
Ma et al., "Decomposition Strategies for Self-Aligned Double Patterning," 2010 Proc. of SPIE, vol. 7641, 13 pages.*
Nakajima et al., "Detailed Routing with Advanced flexibility and in Compliance with Self-Aligned Double Patterning Constraints," 2013 Proc. of SPIE, vol. 8684, 10 pages.*

(Continued)

*Primary Examiner* — Leigh Garbowski
(74) *Attorney, Agent, or Firm* — Steven J. Meyers; Hoffman Warnick LLC

(57) ABSTRACT

Various embodiments include computer-implemented methods, computer program products and systems for aligning a set of orthogonal circuit elements in an integrated circuit (IC) layout. In some embodiments, a computer-implemented method for aligning a set of orthogonal circuit elements in an IC layout includes: classifying each orthogonal circuit element in the set of orthogonal circuit elements as including a first space-designated edge and a second space-designated edge; and aligning each orthogonal circuit element on an edge placement grid according to the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

20 Claims, 7 Drawing Sheets

(56) References Cited

OTHER PUBLICATIONS

Luk-Pat et al., "Deisgn Compliance for Spacer Is Dielectric (SID) Patterning," 2012 Proc. of SPIE vol. 8326, 13 pages.*

Ma et al., "Self-Aligned Double Patterning (SADP) Compliant Design Flow," 2012 Proc. of SPIE vol. 8327, 13 pages.*

Mirsaeedi et al., "Self-Aligned Double Patterning (SADP) Friendly Detailed Routing," 2011 Proc. of SPIE vol. 7974, 9 pages.*

Gao et al., "Self-aligned Double Patterning Compliant Routing with In-Design Physical Verification Flow," 2013 Proc. of SPIE vol. 8684, 9 pages.*

Mirsaeedi et al., "Self-Aligned Double Patterning (SADP) Friendly Detailed Routing," Proc. of SPIE vol. 7974, 2011, 9 pages.

Gao et al, "Flexible Self-aligned Double Patterning Aware Detailed Routing with Prescribed Layout Planning," ECE Dept. Univ. of Texas at Austin, no date, 38 pages.

* cited by examiner

ORTHOGONAL CIRCUIT ELEMENT ROUTING

TECHNICAL FIELD

Aspects of the disclosure relate generally to integrated circuits. More particularly, various aspects of the disclosure relate to integrated circuit layouts and related processing.

BACKGROUND

The continued delay in extreme ultra violet (EUV) lithography is driving the introduction of increasingly complex, costly and design-restrictive double-patterning (DP) solutions. As wiring pitches decrease (e.g., below 50 nanometer (nm) with 193 nm immersion), immersion lithography has involved the use of sidewall image transfer (SIT) double-patterning to overcome the overlay-induced dielectric breakdown failures that limit the achievable pitch scaling with older conventional litho-etch-litho-etch (LELE) double-patterning.

In SIT double-patterning, frequency doubling of the lithography-formed images does not occur by interdigitating two exposures (as in LELE), but by depositing sidewall spacers onto both sides of a lithographically-formed image. A second exposure, referred to as a "block" mask, is then used to add two-dimensional detail to the images formed by the SIT process.

However, a challenge in patterning approaches, e.g., SIT DP comes from the design rules necessary to ensure clean "block mask" generation. For example, line-ends of wire shapes in the layout (e.g., router-generated layout) are constrained such that the resulting block mask is free of minimum width space violations. Further, corner rounding effects on the block mask can cause unmanufacturable line-end angles.

These process constraints on the block mask result in line-end stagger rules, which can be described as:

For two line ends facing opposite directions, a line end stagger on neighboring tracks of, +K>Stagger>−K is forbidden; and For line ends facing the same direction, a line end stagger on neighboring tracks of, +K>Stagger>0 as well as 0>Stagger>−K are forbidden.

However, implementing these line-end stagger rules in a conventional layout router will greatly reduce routing efficiency, and make the use of certain patterning approaches (e.g., SIT) unfeasible. This issue may be particularly significant for design rules that span multiple neighboring tracks, e.g., a line end stagger of +K>Stagger>−K is allowed if the offending line ends are separated by two empty tracks.

Further, in addition to the line-end stagger rules, the line ends must also satisfy two minimum spacing rules: 1) line-end to line-end spacing rule (T); and 2) line-end to line-side rule (E). These two rules come into play when line edges face one another with a non-minimum run length.

It is known in the art that line-end spacing rules cause challenges in conventional routers, primarily because it is difficult to model these rules precisely. Typically, T>E, and it is sometimes not known whether T or E applies prior to modeling. Stagger spacing rules can introduce several further complexities to the modeling of line-end spacings. For line-ends that occur in adjacent routing tracks, there are also several spacing choices relative to neighboring elements, for example: 0, −K, +K. The combination of spacing rules on the same (and adjacent) tracks, with discrete, non-continuous solutions, can have a negative impact on the efficiency and optimality of path search algorithms.

BRIEF SUMMARY

Various embodiments include computer-implemented methods, computer program products and systems for aligning a set of orthogonal circuit elements in an integrated circuit (IC) layout. In some embodiments, a computer-implemented method for aligning a set of orthogonal circuit elements in an IC layout includes: classifying each orthogonal circuit element in the set of orthogonal circuit elements as including a first space-designated edge and a second space-designated edge; and aligning each orthogonal circuit element on an edge placement grid according to the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

A first aspect includes a computer-implemented method for aligning a set of orthogonal circuit elements in an integrated circuit (IC) layout, the method including: classifying each orthogonal circuit element in the set of orthogonal circuit elements as including a first space-designated edge and a second space-designated edge; and aligning each orthogonal circuit element on an edge placement grid according to the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

A second aspect includes a computer program product having program code, which when executed on at least one computing device, causes the at least one computing device to align a set of orthogonal circuit elements in an integrated circuit (IC) layout by performing actions including: classifying each orthogonal circuit element in the set of orthogonal circuit elements as including a first space-designated edge and a second space-designated edge; and aligning each orthogonal circuit element on an edge placement grid according to the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

A third aspect includes a system including: at least one computing device configured to align a set of orthogonal circuit elements in an integrated circuit (IC) layout by performing actions including: classifying each orthogonal circuit element in the set of orthogonal circuit elements as including a first space-designated edge and a second space-designated edge; and aligning each orthogonal circuit element on an edge placement grid according to the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

Figure 1:
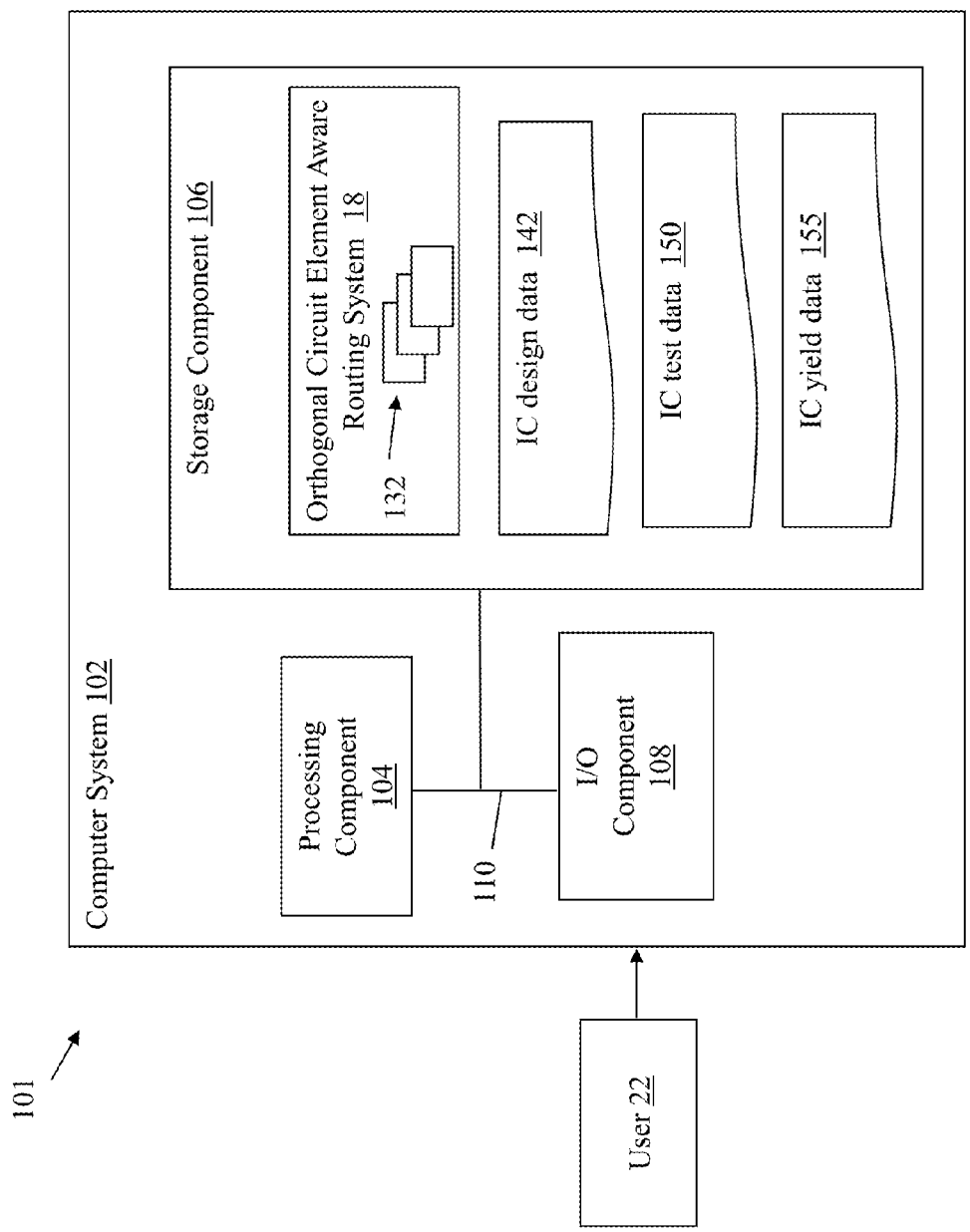
FIG. 1 shows a schematic environment for implementing a sidewall-image-transfer (SIT) aware routing system according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the disclosure relate generally to integrated circuits. More particularly, various aspects of the disclosure relate to integrated circuit layouts and related processing.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

It is understood that commonly labeled elements between the figures can represent substantially identical components, unless otherwise noted. Redundant description of these elements is minimized herein for the purposes of clarity.

In contrast to the herein-noted approaches for routing of parameters in integrated circuit layouts, various embodiments employ computer-implemented methods, computer program products and/or computer systems that utilize a "correct-by-construction" solution for orthogonal circuit element-aware routing based on a directional design grid. Various embodiments include approaches that identify edges of orthogonal elements as belonging to a particular side (or position) of a grid, e.g., a left edge or a right edge. These embodiments then force those edges of the orthogonal elements to terminate on a corresponding grid line within a grid layout. For example, left edges of shapes are aligned to terminate on left grid lines, and right edges of shapes are aligned to terminate on right grid lines. In various embodiments, these approaches ensure efficient and accurate implementation of complex line-end stagger rules associated with second generation double-patterning.

As used herein, the term "orthogonal element" and/or "orthogonal circuit element" refers to any element in an integrated circuit that has at least one edge, e.g., a right-angled edge. In various embodiments, an orthogonal circuit element will have at least two defined edges, e.g., two defined right-angled edges. In some cases, an orthogonal circuit element includes at least one edge that is longer than one or more remaining edges, establishing a "dominant direction", e.g., a longer direction than the remaining directions. For example, an orthogonal circuit element can include a rectangular shape with two edges being longer than two remaining edges. In various embodiments, the term "orthogonal circuit element" can refer to wiring shapes, connectors, etc., within an integrated circuit layout. It is understood that the at least one longer edge, in some cases, can include a jogged or otherwise non-planar edge. Other conventional terminology considered to be within the penumbra of an "orthogonal element" or "orthogonal circuit element" includes, line pattern element(s) and/or trimmable circuit element(s).

In various particular aspects, approaches enable orthogonal circuit element—aware routing without impacting routing efficiency by providing a simple "prescriptive design rule" (PDR) solution. Various particular aspects include performing processes including:

A) classifying each orthogonal circuit element (e.g., including one or more "wrong-way" features) as having a first space-designated edge (e.g., left edge, right edge or top edge, bottom edge) and a second space-designated edge (e.g., the other of left/right edge or the other of top/bottom edge).

B) forming an edge placement grid including alternating space-designated grid lines (e.g., left edge lines, right edge lines; top edge lines, bottom edge lines). The edge placement grid can include a grid pitch equal to a minimum stagger amounts between adjacent line edges (e.g., pitch N). For example, N can be represented as N=max(K,T,E). According to various embodiments, the edge placement grid includes a first set of space-designated grid lines separated by a first distance, and a second set of space-designated grid lines separated by a second distance. The first distance and the second distance can be equal to the pitch (N) in various embodiments. In various embodiments, the first set of space-designated grid lines is separated from the second set of space-designated grid lines by an offset distance.

C) instructing a router to place space-designated edges of the orthogonal circuit element on corresponding space-designated grid lines in the edge placement grid.

Placing the space-designated edges on their corresponding grid lines ensures an efficient orthogonal circuit element-compatible routing solution, allowing for generation of a manufacturable block mask for use in a double-patterning process (e.g., a sidewall image transfer, or SIT, double patterning process). That is, according to various embodiments, the approach described herein can be employed with a conventional router to provide a orthogonal circuit element-compatible routing solution without the need to modify that conventional router software/hardware.

Various particular embodiments include a computer-implemented method for aligning a set of orthogonal circuit elements in an integrated circuit (IC) layout. In some cases, the method includes: classifying each orthogonal circuit element in the set of orthogonal circuit elements as including a first space-designated edge and a second space designated edge (e.g., where the first edge opposes the second edge); and aligning each orthogonal circuit element on an edge placement grid having a first set of space-designated grid lines separated by a first distance, and a second set of space-designated grid lines separated by a second distance. In some cases, the first set of space-designated grid lines is separated from the second set of space-designated grid lines by an offset distance.

As described herein, various particular embodiments are also drawn to systems (e.g., systems including at least one computing device) and computer program products for aligning a set of orthogonal circuit elements in an IC layout.

Turning to the drawings, FIG. 1 depicts an illustrative environment 101 for aligning a set of orthogonal circuit elements in an integrated circuit (IC) layout according to embodiments. To this extent, the environment 101 includes a computer system 102 that can perform a process described herein in order to align a set of orthogonal circuit elements in an IC layout. In particular, the computer system 102 is shown as including an orthogonal circuit element aware routing system 18, which makes computer system 102 operable to align a set of orthogonal circuit elements in an IC layout by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the orthogonal circuit element aware routing system 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the orthogonal circuit element aware routing system 18 can manage a set of interfaces (e.g., graphical user interface(s), application program interface, etc.) that enable human and/or system users 22 to interact with the orthogonal circuit element aware routing system 18. Further, the orthogonal circuit element aware routing system 18 can manage (e.g., store, retrieve, create, manipulate, organize, present, etc.) data, such as IC design and/or test data (including wafer and chip-level data) using any solution.

In any event, the computer system 102 can comprise one or more general purpose computing articles of manufacture (e.g., computing devices) capable of executing program code, such as the orthogonal circuit element aware routing system 18, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the SIT aware routing system 18 can be embodied as any combination of system software and/or application software.

Further, the orthogonal circuit element aware routing system 18 can be implemented using a set of modules 132. In this case, a module 132 can enable the computer system 102 to perform a set of tasks used by the orthogonal circuit element aware routing system 18, and can be separately developed and/or implemented apart from other portions of the orthogonal circuit element aware routing system 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of orthogonal circuit element aware routing system 18 fixed thereon (e.g., one or more modules 132). However, it is understood that the computer system 102 and orthogonal circuit element aware routing system 18 are only representative of various possible equivalent computer systems that may perform a process described herein. To this extent, in other embodiments, the functionality provided by the computer system 102 and orthogonal circuit element aware routing system 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC design data 142, IC test data 150 and/or IC yield data 155 using any solution. For example, the computer system 102 can generate and/or be used to retrieve IC design data 142, IC test data 150 and/or IC yield data 155 from one or more data stores, receive IC design data 142, IC test data 150 and/or IC yield data 155 from another system, send IC design data 142, IC test data 150 and/or IC yield data 155 to another system, etc. IC design data 142 can include data about a layout of an IC, including design parameters such as spacings, tolerances, dimensions (e.g., wire widths), intended current levels, etc., IC test data 150 can include data gathered from testing (either through simulation or physical testing of product(s)) at least a portion of an IC to verify one or more of the design parameters, and IC yield data 155 can include data such as predicted and/or actual yield data about one or more production processes in the formation of the IC (including chip-level, wafer-level, and/or wafer-level data) or a component of the IC (e.g., one or more chip packages).

While shown and described herein as methods, systems, and computer program products for aligning a set of orthogonal circuit elements in an IC layout, it is understood that aspects of the invention further provide various alternative embodiments. For example, in one embodiment, the invention provides a computer program fixed in at least one computer-readable medium, which when executed, enables a computer system to align a set of orthogonal circuit elements in an IC layout. To this extent, the computer-readable medium includes program code, such as the orthogonal circuit element aware routing system 18 (FIG. 1), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the orthogonal circuit element aware routing system 18 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for aligning a set of orthogonal circuit elements in an IC layout. In this case, a computer system, such as the computer system 102 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 2:
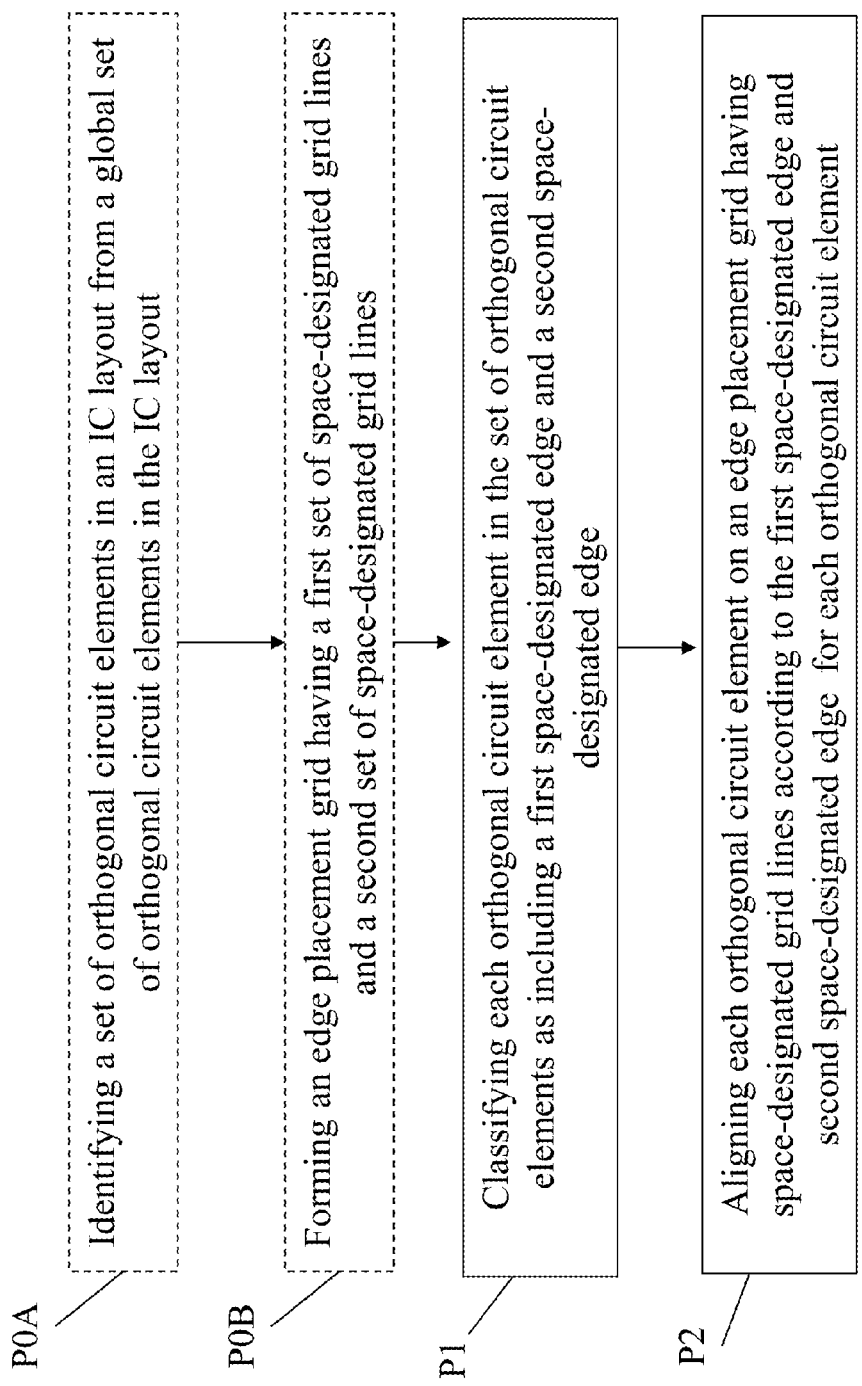
FIG. 2 shows a flow diagram depicting a process according to various embodiments.

FIG. 2 shows a flow diagram illustrating a process of aligning a set of orthogonal circuit elements in an IC layout according to various embodiments of the invention. The process can include:

Process P0A (optional pre-process): identifying the set of orthogonal circuit elements in the IC layout from a global set of orthogonal circuit elements in the IC layout. In various embodiments, this process can include obtaining a global set of orthogonal circuit elements in an IC layout. In some cases, this can include obtaining IC layout data (e.g., design data 142) and identifying one or more orthogonal circuit element elements within that IC layout data.

Process P0B (optional pre-process, performed prior to one or both of process P1 or process P2): forming an edge placement grid having a first set of space-designated grid lines and a second set of space designated grid lines. The sets (first, second) of space-designated grid lines are separated from one another by an offset distance, as defined herein. In some cases, the space-designated grid lines include vertically extending "left" (first set) and "right" (second set) grid lines, while in other cases, the space-designated grid lines include horizontally extending "top" (first set) and "bottom" (second set) grid lines. These grid lines can be separated on the edge placement grid by a grid pitch distance (N). In various embodiments, N=max (K, T, E), where K=a line end stagger rule, T=a line-end to line-end spacing rule and E=a line-end to line-side rule. In various embodiments, the space-designated grid lines include alternating space-designated grid lines, where adjacent space-designated grid lines have an opposite space designation. That is, adjacent lines in the space-designated grid will be a "left" grid line next to a "right" grid line, or a "top" grid line next to a "bottom" grid line.

Process P1: after identifying the set of orthogonal circuit elements, the process can include classifying each orthogonal circuit element in the set of orthogonal circuit elements as including a first space-designated edge (e.g., a right edge or a left edge) and a second space-designated edge (e.g., the other one of the right edge or left edge). As described herein, depending upon the type of grid lines in the space-designated grid, each orthogonal circuit element in the set can be classified according to two dominant space-designated edges (e.g., left and right, top and bottom).

Process P2: after the classifying of each orthogonal circuit element (P1), the process can include aligning each orthogonal circuit element on an edge placement grid having space-designated grid lines according to the first space-designated edge and the second space-designated edge for the each orthogonal circuit element. This process includes aligning left edges of orthogonal circuit element on left grid lines and right edges of those orthogonal circuit elements on right grid lines (in a grid including left and right grid lines, respectively), and/or top edges of orthogonal circuit elements on top grid lines and bottom edges of orthogonal circuit elements on bottom grid lines (in a grid including top and bottom grid lines, respectively).

Figure 3:
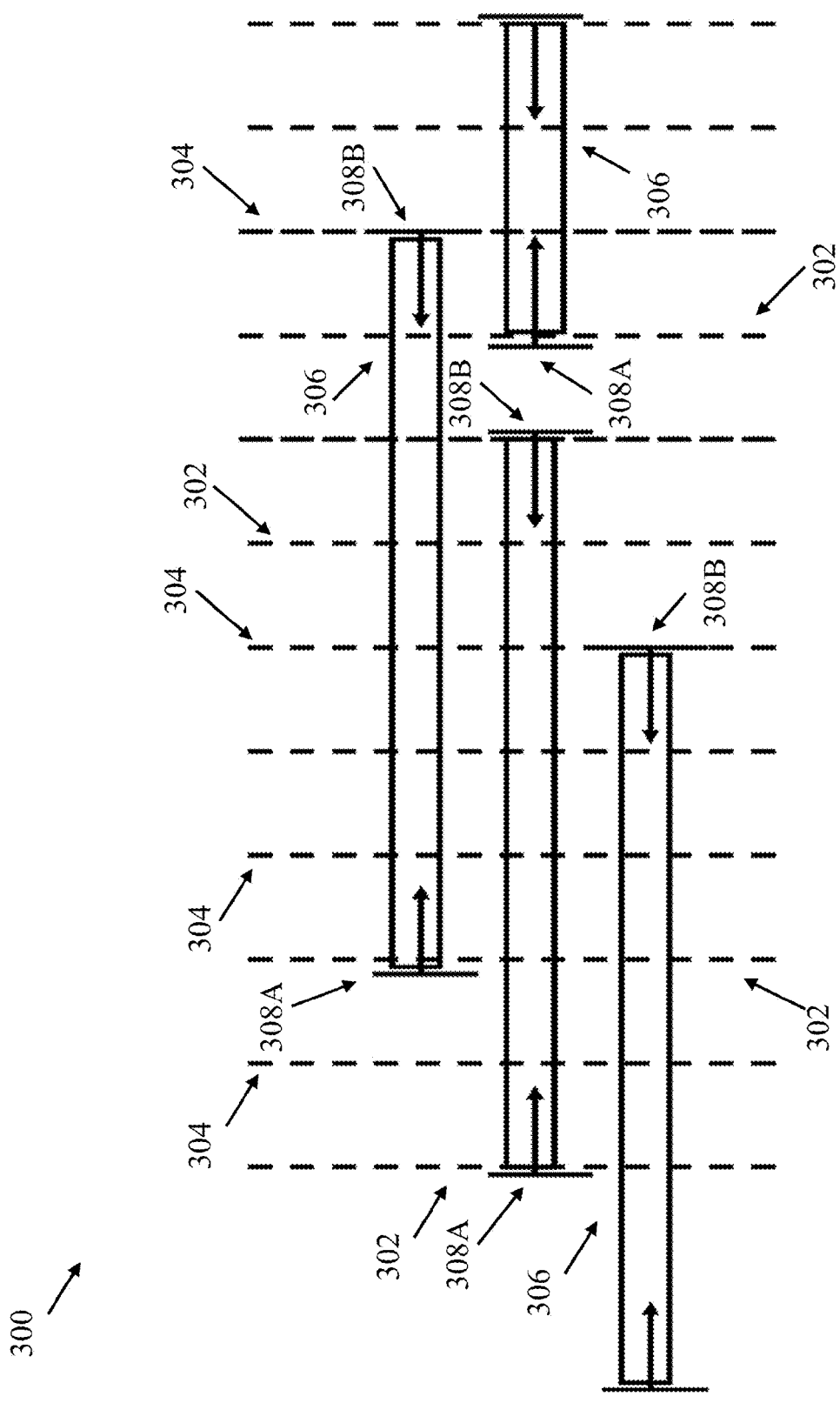
FIG. 3 shows an example of an illustrative space-designated grid according to various embodiments.

FIG. 3 shows an illustrative space-designated grid 300 according to various embodiments. The space-designated grid 300 in this example can include left grid lines 302 and right grid lines 304. Also illustrated in the space-designated grid 300 are a plurality of orthogonal circuit elements 306, each classified with a first space-designated edge 308A (e.g., left edge) and a second space designated edge 308B (e.g., right edge), that dictate with which type of space-designated grid line (e.g., left grid line 302 or right grid line 304) that the orthogonal circuit element 306 will align.

Figure 4:
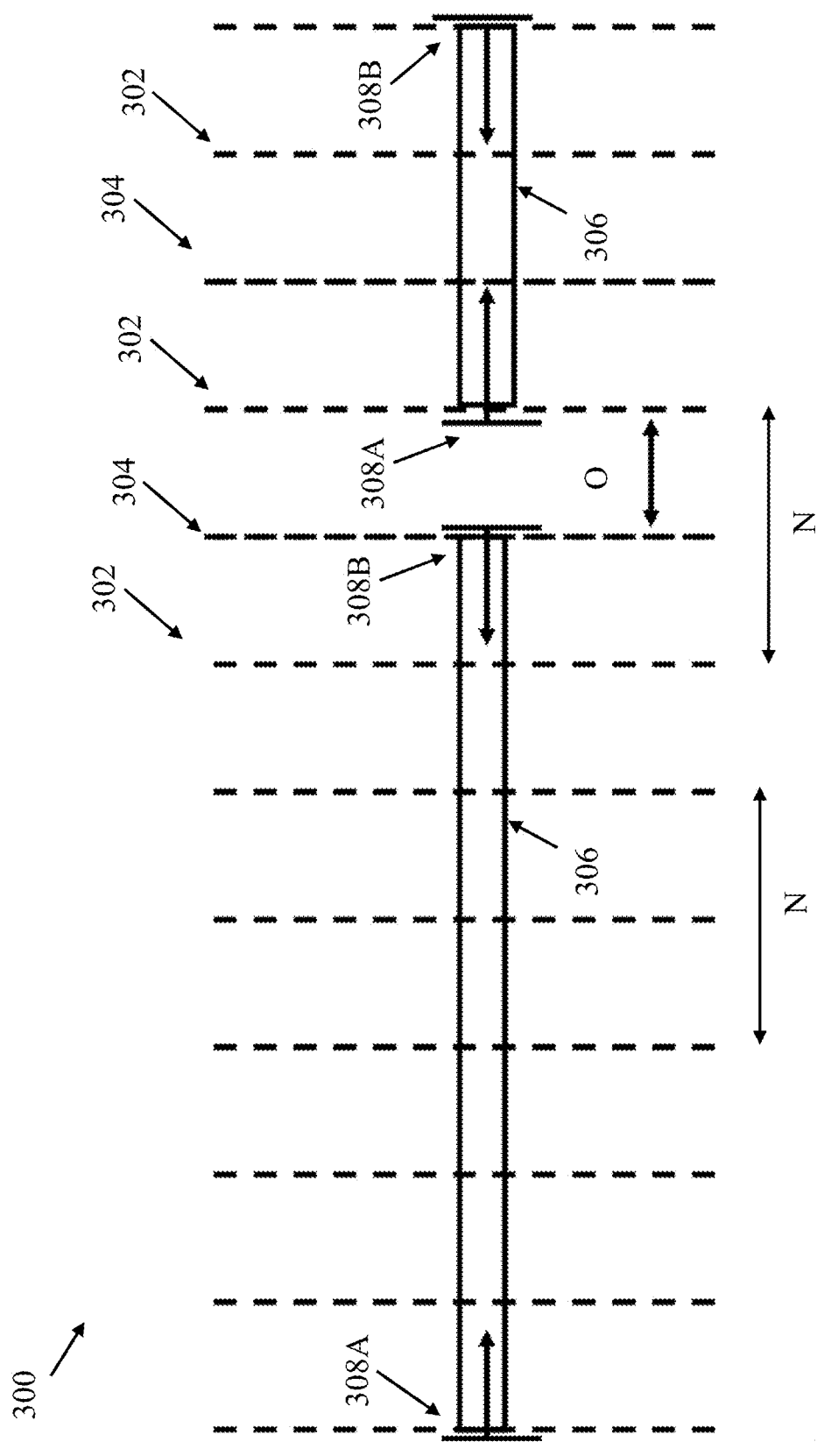
FIG. 4 shows a close-up depiction of a portion of the space-designated grid of FIG. 3, illustrating the spacing N between two adjacent grid lines.

FIG. 4 shows a close-up depiction of a portion of the space-designated grid 300, illustrating the pitch spacing O between two adjacent grid lines (e.g., left grid line 304 and right grid line 306). As shown in this embodiment, the spacing between adjacent grid lines is substantially uniform, at a distance O. However, in other embodiments, the spacing between adjacent grid lines can be substantially non-uniform, and can be derived according to a grid spacing formula. FIG. 4 also illustrates the pitch distance (N) between neighboring lines within the same set of space designed lines (e.g., left grid lines 302; or right grid lines 304).

Figure 5:
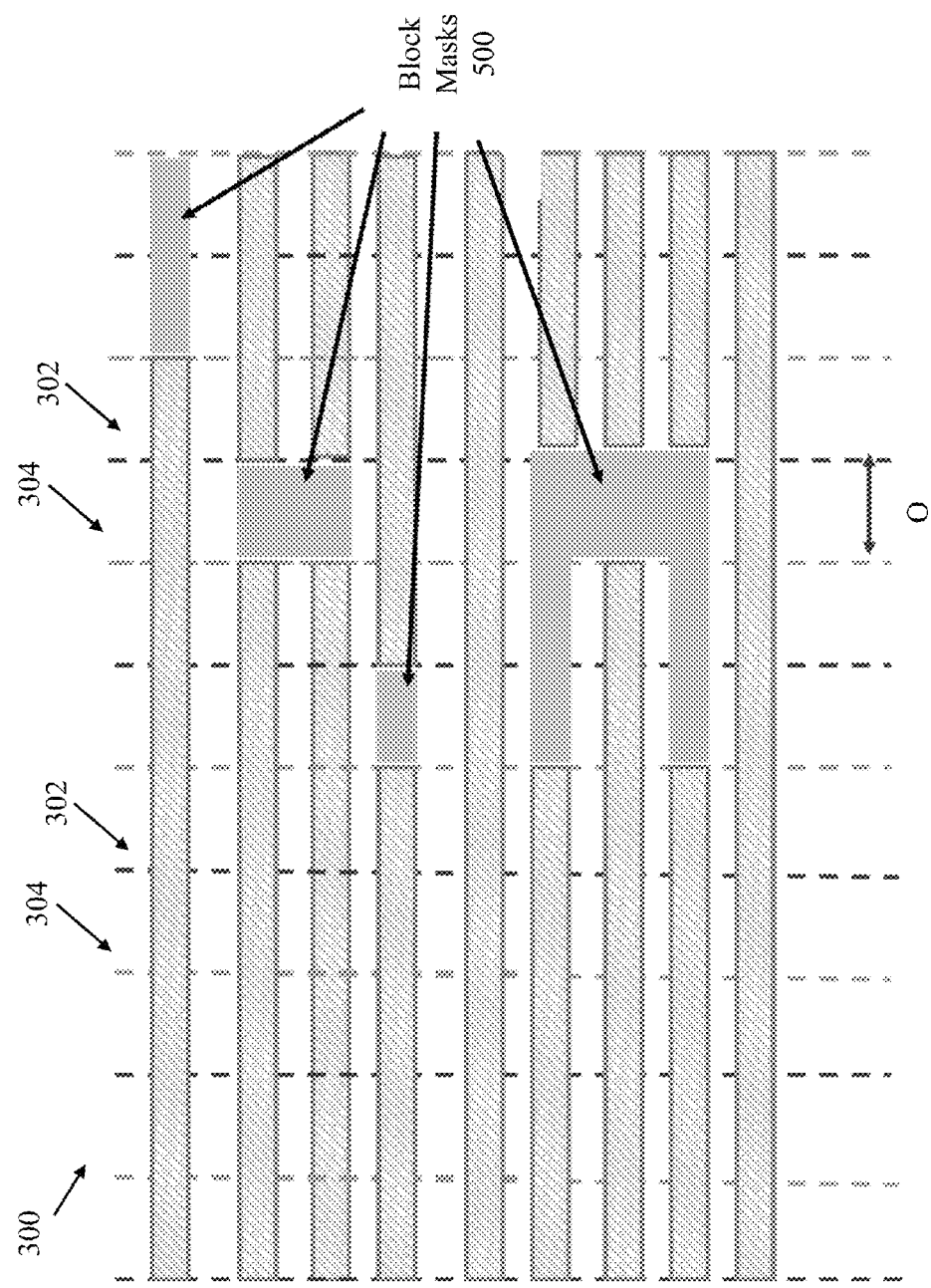
FIG. 5 shows an example of formation of block masks over the spaced-designated grid of FIGS. 3-4.

FIG. 5 illustrates formation of example block masks 500 overlying spaces vacated by the plurality of orthogonal circuit elements 306 in the space-designated grid 300 in FIG. 3. Aligning the plurality of orthogonal circuit elements 306 along grid lines (e.g., left grid line 302, right grid line 304 allows for efficient determination of the size, location and orientation of block masks 500. The block masks 500 shown in the example of FIG. 5 can be efficiently manufacturable due to the alignment of orthogonal circuit elements 306 on the space-designated grid 300.

Figure 6:
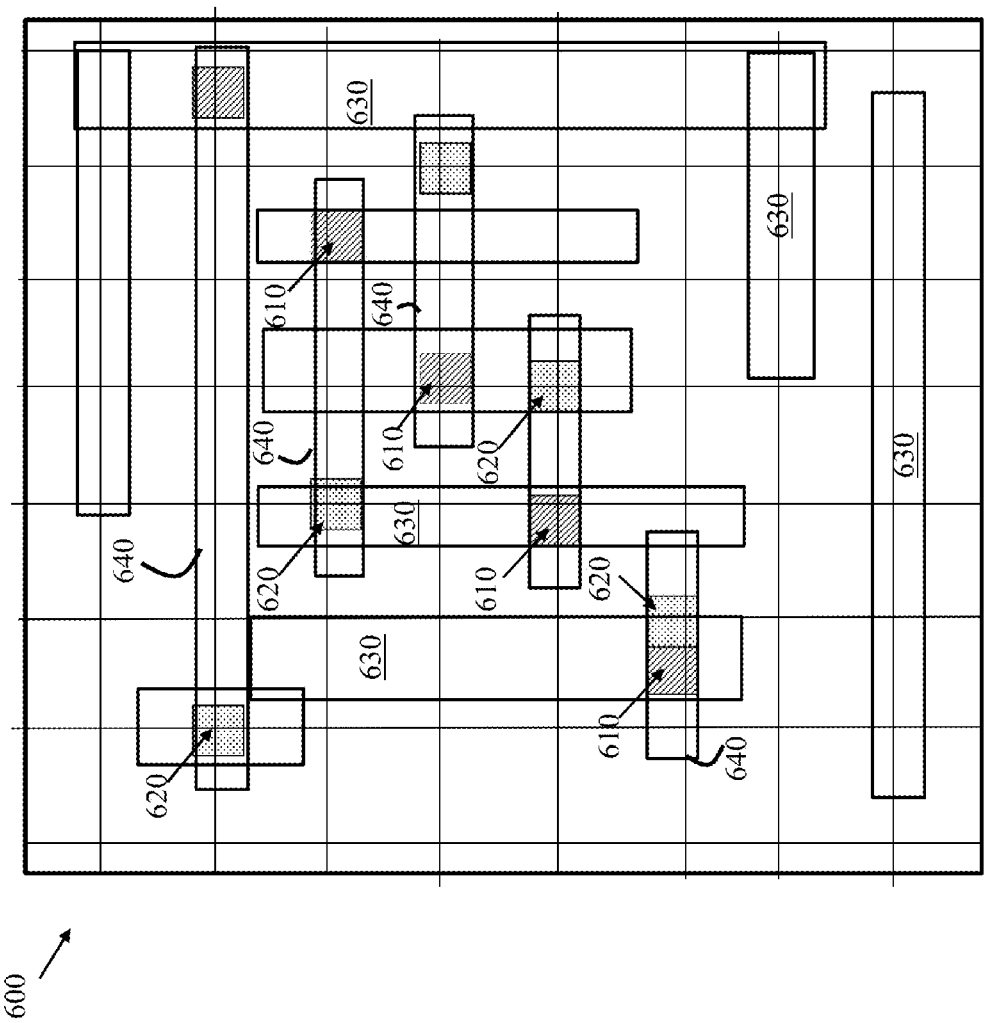
FIGS. 6-7 shows sample routing layouts that illustrate how line-end stagger rules described according to various embodiments allow for placement of lines with adequate spacings, tolerances, etc.
Figure 7:
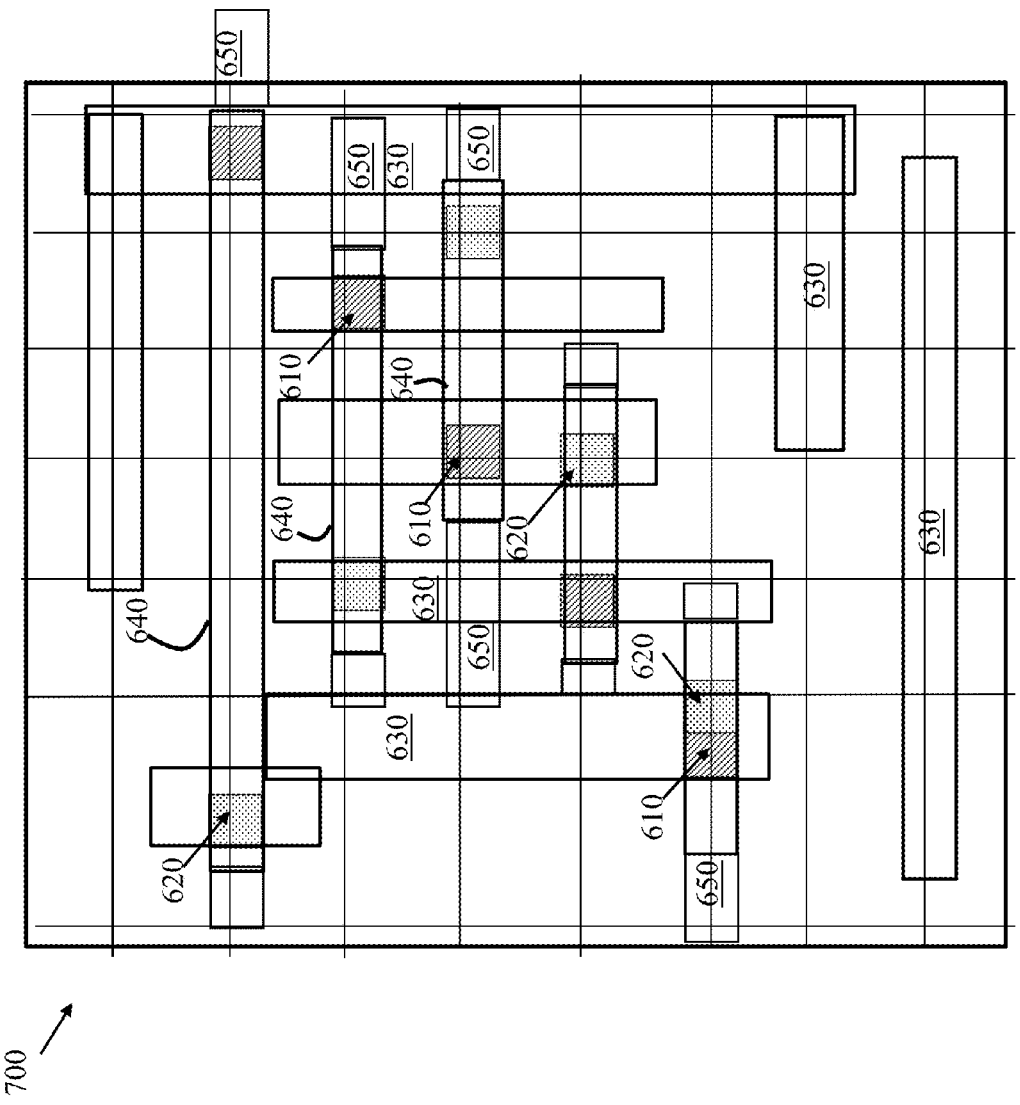

FIGS. 6-7 shows sample routing layouts 600, 700 which illustrate how line-end stagger rules such as those shown and described herein allow for placement of lines with adequate spacings, tolerances, etc. The sample routing layouts 600, 700 of FIGS. 6-7 illustrate first level vias 610, second level vias 620, first metal wire layers 630, second metal wire layers 640 and second metal layer extensions 650.

It is understood that aspects of the invention can be implemented as part of a business method that performs a process described herein on a subscription, advertising, and/or fee basis. That is, a service provider could offer to provide a orthogonal circuit element aware routing system as described herein. In this case, the service provider can manage (e.g., create, maintain, support, etc.) a computer system, such as computer system 102 (FIG. 1), that performs a process described herein for one or more customers. In return, the service provider can receive payment from the customer(s) under a subscription and/or fee agreement, receive payment from the sale of advertising to one or more third parties, and/or the like.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A computer-implemented method for aligning a set of orthogonal circuit elements in an integrated circuit (IC) layout, the method comprising:
   classifying each orthogonal circuit element in the set of orthogonal circuit elements as including a first space-designated edge and a second space-designated edge, wherein the first space-designated edge opposes the second space-designated edge, and wherein the first space-designated edge and the second space-designated edge define a dominant direction as edges in the orthogonal circuit element that are longer than at least one of remaining edges in the orthogonal circuit element; and
   aligning each orthogonal circuit element on an edge placement grid according to the dominant direction as defined by the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

2. The computer-implemented method of claim 1, further comprising identifying the set of orthogonal circuit elements in the IC layout from a global set of orthogonal circuit elements in the IC layout.

3. The computer-implemented method of claim 1, further comprising forming the edge placement grid.

4. The computer-implemented method of claim 1, wherein the first set of space-designated grid lines alternates with the second set of space-designated grid lines, and wherein adjacent space-designated grid lines have an opposite space designation.

5. The computer-implemented method of claim 1, wherein the first distance and the second distance are each equal to a grid pitch distance (N).

6. The computer-implemented method of claim 5, wherein N=max (K, T, E), wherein K=a grid line end stagger rule, T=a grid line-end to grid line-end spacing rule and E=a grid line-end to grid line-side rule.

7. The computer-implemented method of claim 1, wherein the first set of space-designated grid lines includes either a left edge or a right edge, and wherein the second set of space-designated grid lines includes the other of the left edge or the right edge.

8. The computer-implemented method of claim 1, wherein the first set of space-designated grid lines includes either a top edge or a bottom edge, and wherein the second set of space-designated grid lines includes the other of the top edge or the bottom edge.

9. A computer program product comprising program code stored on a non-transitory computer readable medium, which when executed on at least one computing device, causes the at least one computing device to align a set of orthogonal circuit elements in an integrated circuit (IC) layout by performing actions including:
   classifying each orthogonal circuit element in the set of orthogonal circuit elements as including a first space-designated edge and a second space-designated edge, wherein the first space-designated edge opposes the second space-designated edge, and wherein the first space-designated edge and the second space-designated edge define a dominant direction as edges in the orthogonal circuit element that are longer than at least one of remaining edges in the orthogonal circuit element; and
   aligning each orthogonal circuit element on an edge placement grid according to the dominant direction as defined by the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

10. The computer program product of claim 9, further comprising identifying the set of orthogonal circuit elements in the IC layout from a global set of orthogonal circuit elements in the IC layout.

11. The computer program product of claim 9, further comprising forming the edge placement grid.

12. The computer program product of claim 9, wherein the first set of space-designated grid lines alternates with the second set of space-designated grid lines, and wherein adjacent space-designated grid lines have an opposite space designation.

13. The computer program product of claim 9, wherein the first distance and the second distance are each equal to a grid pitch distance (N).

14. The computer program product of claim 13, wherein N=max (K, T, E), wherein K=a grid line end stagger rule, T=a grid line-end to line-end spacing rule and E=a grid line-end to grid line-side rule.

15. The computer program product of claim 9, wherein the first set of space-designated grid lines includes either a left edge or a right edge, and wherein the second set of space-designated grid lines includes the other of the left edge or the right edge.

16. The computer program product of claim 9, wherein the first set of space-designated grid lines includes either a top edge or a bottom edge, and wherein the second set of space-designated grid lines includes the other of the top edge or the bottom edge.

17. A system comprising:
at least one computing device configured to align a set of orthogonal circuit elements in an integrated circuit (IC) layout by performing actions including:
classifying each orthogonal circuit element in the set of orthogonal circuit elements as including a first space-designated edge and a second space-designated edge, wherein the first space-designated edge opposes the second space-designated edge, and wherein the first space-designated edge and the second space-designated edge define a dominant direction as edges in the orthogonal circuit element that are longer than at least one of remaining edges in the orthogonal circuit element; and
aligning each orthogonal circuit element on an edge placement grid according to the dominant direction as defined by the first space-designated edge and the second space-designated edge, the edge placement grid having a first set of space-designated grid lines separated by a first distance, and a second set of space-designated grid lines separated by a second distance, wherein the first set of space-designated grid lines is separated from the second set of space-designated grid lines by an offset distance.

18. The system of claim 17, wherein the at least one computing device is further configured to identify the set of orthogonal circuit elements in the IC layout from a global set of orthogonal circuit elements in the IC layout.

19. The system of claim 17, wherein the at least one computing device is further configured to form the edge placement grid.

20. The system of claim 17, wherein the first set of space-designated grid lines alternates with the second set of space-designated grid lines, and wherein adjacent space-designated grid lines have an opposite space designation.

* * * * *